United States Patent
Inoue et al.

(10) Patent No.: US 6,806,941 B2
(45) Date of Patent: Oct. 19, 2004

(54) PATTERN FORMING METHOD AND PATTERN FORMING APPARATUS

(75) Inventors: Soichi Inoue, Yokohama (JP); Iwao Higashikawa, Tokyo (JP); Yoji Ogawa, Yokohama (JP); Shigehiro Hara, Kawasaki (JP); Kazuko Yamamoto, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 62 days.

(21) Appl. No.: 10/006,133

(22) Filed: Dec. 10, 2001

(65) Prior Publication Data

US 2002/0045132 A1 Apr. 18, 2002

Related U.S. Application Data

(62) Division of application No. 09/705,870, filed on Nov. 6, 2000, now Pat. No. 6,335,145, which is a division of application No. 09/461,332, filed on Dec. 15, 1999, now Pat. No. 6,165,652, which is a division of application No. 08/838,944, filed on Apr. 23, 1997, now Pat. No. 6,040,114.

(30) Foreign Application Priority Data

Apr. 26, 1996 (JP) ............................................. 8-107439

(51) Int. Cl.$^7$ ............................................... G03B 27/42
(52) U.S. Cl. ........................................................ 355/53
(58) Field of Search ............................... 355/53; 430/5, 430/296, 313, 318; 438/24, 41

(56) References Cited

U.S. PATENT DOCUMENTS

| 4,595,282 A | * | 6/1986 | Takahashi .................... 355/53 |
| 4,735,881 A |   | 4/1988 | Kobayashi et al. |
| 5,117,254 A | * | 5/1992 | Kawashima et al. .......... 355/43 |
| 5,140,366 A | * | 8/1992 | Shiozawa et al. ............. 355/53 |
| 6,049,085 A | * | 4/2000 | Ema ....................... 250/492.22 |

FOREIGN PATENT DOCUMENTS

JP 8-15138 2/1996

* cited by examiner

*Primary Examiner*—Alan Mathews
(74) *Attorney, Agent, or Firm*—Oblon, Spivak, McClelland, Maier & Neustadt, P.C.

(57) ABSTRACT

A method of forming a pattern for a semiconductor device comprises the steps of forming a photosensitive film on a substrate and radiating the photosensitive film on the substrate with a beam of a predetermined shape consisting of one of a charged particle beam and an electromagnetic beam, thereby forming an exposed region of a desired shape, the latter step including the step of exposing each of unit regions by a single shot of the beam of the predetermined shape for a predetermined period of time, repeating the exposure a plurality of times, and butt-joining the exposed unit regions to thereby form the exposed region of the desired shape, wherein, in the step of forming the exposed region of the desired shape, butting portions of the unit regions are situated in a first area of a layer to be formed other than a second area in the layer in which predetermined characteristics of a function of the semiconductor device are determined by a pattern width of the exposed region in association with another pattern formed in another layer.

8 Claims, 7 Drawing Sheets

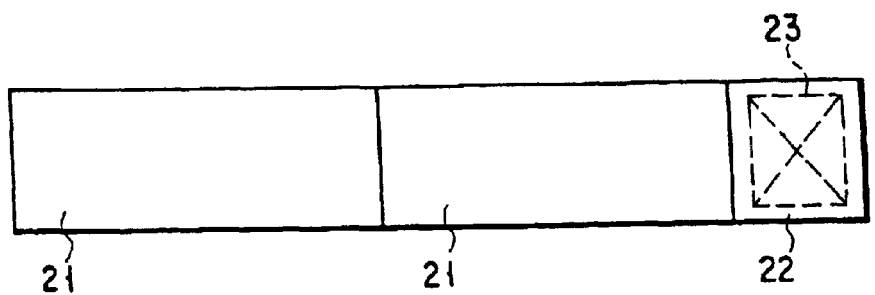
F I G. 3A
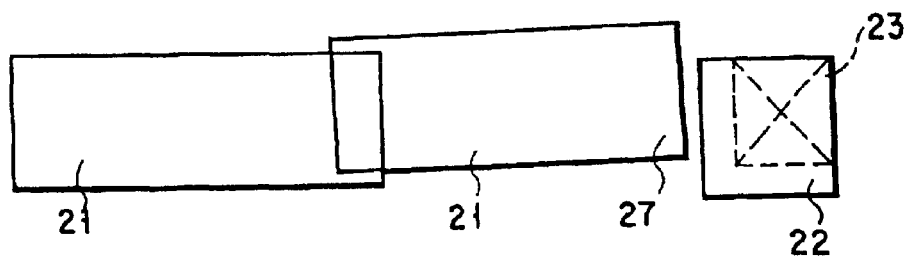
F I G. 3B
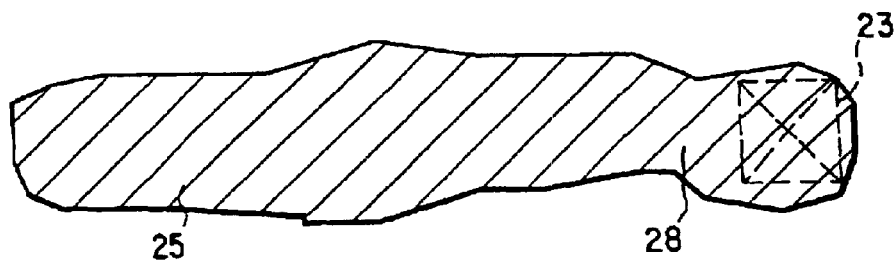
F I G. 3C
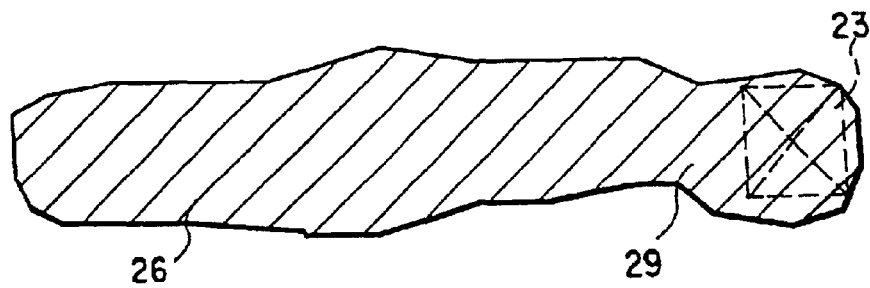
F I G. 3D

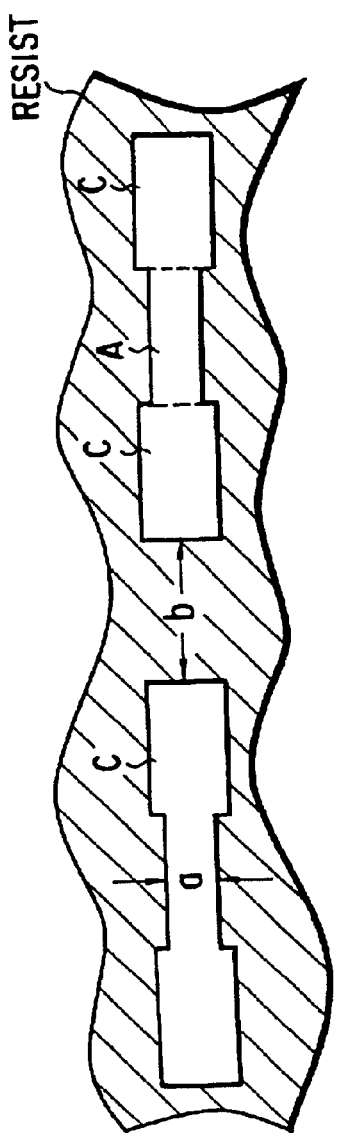
F I G. 6A
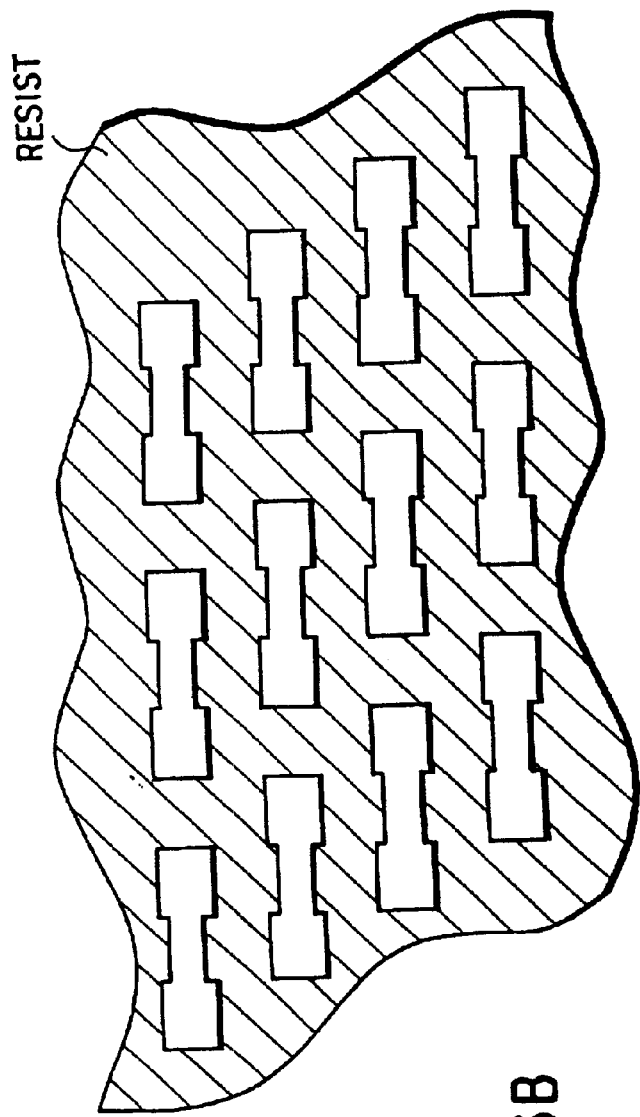
F I G. 6B

PATTERN FORMING METHOD AND PATTERN FORMING APPARATUS

BACKGROUND OF THE INVENTION

This invention relates to a pattern forming technique using a charged particle beam or an electromagnetic wave beam, and more particularly to a pattern forming method and a pattern forming apparatus for positioning a beam of any voluntary shape and repeating shot exposure and butt-joining shots to form a desired pattern.

With the advance of high integration techniques relating to VLSIs and pattern dimension refining techniques, it has been difficult to secure accurate pattern dimensions. In particular, it is considered necessary to keep the dimensions of gate patterns within ±10% of the target dimension, in order to restrain variations in the characteristics of a transistor within an allowable range. Further, it is considered necessary to keep a dimension error due to lithography within ±7% of the above target dimension. For example, where the gate pattern dimension is 0.15 $\mu$m, the allowable dimension error in the lithography process is less than ±0.0105 $\mu$m.

Consider the case of forming a device pattern by first forming a master mask (a photomask, an X-ray mask, an electron beam mask, an ion beam mask, etc.) for the device pattern using a mask writing tool (which writes a pattern with an electron beam or a laser beam), then radiating the master mask with electromagnetic waves such as light, an X-ray, etc., or with charged particles such as an electron beam, an ion beam, etc. to thereby project an image of the mask on a wafer. In this case, the writing accuracy of the mask writing tool may be a main cause of the dimension error.

In the shot-by-shot exposure processing represented by the electron beam exposure technique, there are known a raster scan system for scanning a constant beam, and a vector scan system for positioning a beam at an individual coordinate to perform exposure thereat. The raster scan system performs beam scanning in an analog manner. In this case, to increase the speed of processing, the speed of beam scanning is increased. If the beam size is reduced in order to enhance the resolution, the speed of processing will inevitably decrease. As a method for realizing higher processing, the vector scan system is proposed, which employs a variable shaped beam and can increase the beam size. In this system, setting of the beam size and positioning of the beam are controlled by digital processing. Accordingly, the throughput and the pattern accuracy depend upon the setting speed of a DAC (digital-to-analog converter) employed therein.

A master mask such as a photomask, etc. requires high accuracy in pattern position and dimension. For example, a photomask for a semiconductor element requires that variations in pattern dimension should fall within a range of about 1/30 or less of a minimum line width, and variations in position should fall within a range of 5% or less of the minimum line width. In addition, further enhancement of accuracy is now required since the size of a semiconductor element has been reduced to 70% in every three years.

BRIEF SUMMARY OF THE INVENTION

It is the object of the invention to provide a pattern forming method and a pattern forming apparatus, which use position information concerning an area requiring high dimension accuracy in order to realize high writing accuracy.

According to a first aspect of the invention, there is provided a method of forming a pattern for a semiconductor device, comprising:

the step of forming a photosensitive film on a substrate; and the step of radiating the photosensitive film on the substrate with a beam of a predetermined shape obtained from one of a charged particle beam and an electromagnetic beam, thereby forming an exposed region of a desired shape, the step including the step of exposing each of unit regions by a single shot of the beam of the predetermined shape for a predetermined period of time, repeating the exposure a plurality of times, and butt-joining the exposed unit regions to thereby form the exposed region of the desired shape;

wherein, in the step of forming the exposed region of the desired shape, butting portions of the unit regions are situated in a first area of a layer to be formed other than a second area of the layer in which predetermined characteristics of a function of the semiconductor device are determined by a pattern width of the exposed region in association with another pattern formed in another layer.

Preferably, the first area in which the butting portions of the unit regions are situated corresponds to an isolation region employed in the semiconductor device.

More preferably, the second area in which the predetermined characteristics of the predetermined function are determined by the pattern width of the exposed region corresponds to an active region incorporated in a transistor in the semiconductor device.

Also preferably, the region in which the predetermined characteristics of the predetermined function are determined by the pattern width of the exposed region corresponds to an electrode region to which an interlayer contact in the semiconductor device is connected.

The step of forming the photosensitive film on the substrate may use a positive-type photosensitive material or a negative-type photosensitive material.

According to a second aspect of the invention, there is provided a method of forming a pattern comprising:

the step of forming a photosensitive film on a substrate; and the step of radiating the photosensitive film on the substrate with a beam of a predetermined shape obtained from one of a charged particle beam and an electromagnetic beam and emitted from a writing tool, thereby forming an exposed region of a desired shape, the step including the step of exposing each of unit regions by a single shot of the beam of the predetermined shape for a predetermined period of time, repeating the exposure a plurality of times, and butt-joining the exposed unit regions to thereby form the exposed region of the desired shape;

wherein the step of forming the exposed region of the desired shape includes the step of subjecting predetermined ones of the unit regions to single shot exposure, and subjecting the other ones of the unit regions to multiple shot exposure.

Preferably, in the step of forming the exposed region of the desired shape, the multiple shot exposure is performed by repeating the same shot exposure in the same position.

Alternatively, in the step of forming the exposed region of the desired shape, the multiple shot exposure is performed by changing the butting position of the unit regions in units of a single shot exposure treatment.

Alternatively, the step of forming the exposed region of the desired shape selectively uses multiple shot exposure in which the same shot exposure is repeated in the same position, and multiple shot exposure in which the butting position of the unit regions is changed in units of a single shot exposure treatment.

The step of forming the photosensitive film on the substrate may use a positive-type photosensitive material or a negative-type photosensitive material.

Preferably, the step of forming the photosensitive film on the substrate includes the step of using a combination of manners of optical overlap of first and second apertures employed in the writing tool to form the beam of the predetermined shape, and the same combination of the manners of optical overlap of the first and second apertures is used at the time of subjecting to single shot exposure those of the unit regions which have the same shape.

According to a third aspect of the invention, there is provided an apparatus for forming a pattern for a semiconductor device, comprising:

beam shaping means for shaping, to a predetermined shape, one of a charged particle beam and an electromagnetic beam;

positioning means for positioning the position of the beam of the predetermined shape in a single unit region of a substrate with a photosensitive film formed thereon; and shot exposure means for radiating the single unit region with the beam for a predetermined period of time;

wherein the shot exposure means repeats shot exposure in units of a single unit region to thereby form a desired exposed region; and the positioning means sequentially forwards the position in which the beam is to be radiated, butt-joins the single unit region to another single unit region to form a plurality of butt-joined unit regions, and situates butting portions of the butt-joined unit regions constituting the desired exposed region, in a first area of a layer to be formed other than a second area of the first layer in which predetermined characteristics of a function of the semiconductor device are determined by a pattern width of the exposed region in association with another pattern formed in another layer.

The positioning means can cause the second area in which the butting portions of the unit regions are formed, to correspond to an isolation region employed in the semiconductor device.

The positioning means determines the position of the beam such that the second area in which the predetermined characteristics of the predetermined function are determined by the pattern width of the exposed region corresponds to an active region incorporated in a transistor in the semiconductor device.

The positioning means determines the position of the beam such that the second area in which the predetermined characteristics of the predetermined function are determined by the pattern width of the exposed region corresponds to an electrode region to which an interlayer contact in the semiconductor device is connected.

According to a fourth aspect of the invention, there is provided an apparatus for forming a pattern comprising:

beam shaping means for shaping, to a predetermined shape, one of a charged particle beam and an electromagnetic beam;

positioning means for positioning the position of the beam of the predetermined shape in a single unit region of a substrate with a photosensitive film formed thereon; and shot exposure means for radiating the single unit region with the beam for a predetermined period of time;

wherein the shot exposure means subjects predetermined ones of the unit regions to single shot exposure, and the other ones of the unit regions to multiple shot exposure, and the positioning means sequentially forwards the position in which the beam is to be radiated, and butt-joins the single unit region to another single unit region to form a plurality of butt-joined unit regions.

Preferably, the shot exposure means performs the multiple shot exposure by repeating the same shot exposure in the same position.

More preferably, the shot exposure means performs the multiple shot exposure by changing the butting position of the unit regions in units of a single shot exposure treatment.

The shot exposure means may perform the multiple shot exposure by selectively using multiple shot exposure in which the same shot exposure is repeated in the same position, and multiple shot exposure in which the butting position of the unit regions is changed in units of a single shot exposure treatment.

In the pattern exposure method for setting the size of a beam shot and the position of the beam shot by means of digital processing, it is known that a pattern formed by single shot exposure is superior, in principle, in dimension accuracy to a pattern formed by multiple shot exposure. Specifically, pattern portions formed by different shot exposure treatments have variations in dimension accuracy and position accuracy. In the case of a pattern formed by multiple shot exposure, pattern portions formed by different shot exposure treatments may well overlap each other, thereby reducing the accuracy of dimension. On the other hand, in the case of forming each portion of a pattern by repeating the exposure of the same shot, the position accuracy of each portion is averaged, with the result that the pattern accuracy more limited by position accuracy than by shot dimension is enhanced. Such an averaging effect contributes to enhancement of the accuracy of a region formed of an unexposed portion.

Application of the present invention will enhance particular accuracy of a particular pattern portion. For example, in manufacturing a semiconductor element, high accuracy is required for the dimension of a limited portion such as the dimension of a particular pattern, the dimension of a particular portion of a particular pattern, or the distance between particular portions of patterns.

Thus, the accuracy can be enhanced by applying the present invention to a pattern having portions formed by regularly repeating single shot exposure, or by applying the present invention to an extracted particular portion of a pattern. More specifically, a pattern portion which should be limited by a single shot width is subjected to single shot exposure, while other pattern portions are subjected to multiple shot exposure. In this case, the multiple shot exposure portion can obtain high accuracy in the dimension between pattern portions or in the position of each pattern portion, and the single shot exposure portion can obtain high accuracy in the dimension of the shot width.

Moreover, subjecting a peripheral portion of a selected unexposed portion to multiple shot exposure can enhance the accuracy of the dimension of the unexposed portion without significantly reducing the throughput. In addition, the present invention enables exposure of a particular portion with no butting portions, thereby enabling forming of a pattern with little edge roughness and remarkable accuracy of dimension.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3A is a schematic plan view, useful in explaining a mask design according to a second embodiment of the invention, including drawing elements divided by the division method of this invention;

FIG. 3B is a schematic plan view, useful in explaining a shot pattern according to the second embodiment, produced on the basis of the design of FIG. 3A, wherein the divided elements are actually shot on the mask substrate;

FIG. 3C is a schematic plan view, useful in explaining a photomask according to the second embodiment, produced using the shot pattern shown in FIG. 3B;

FIG. 3D is a schematic plan view, useful in explaining a pattern on wafer according to the second embodiment, worked using the photomask shown in FIG. 3C;

FIG. 6A is a view, useful in explaining a mask size employed in a fourth embodiment of the invention; and FIG. 6B is a view, showing a pattern layout according to the fourth embodiment.

DETAILED DESCRIPTION OF THE INVENTION

Before the description of the embodiments of the invention, a problem which may occur in forming a pattern using a charged particle beam or a light beam will be explained.

Figure 1C:
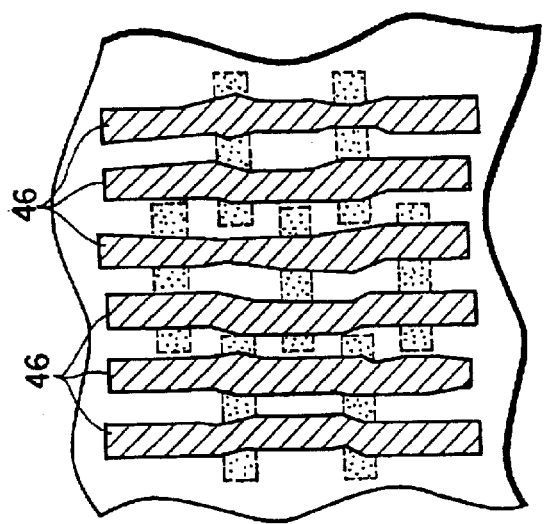
FIG. 1C is a schematic plan view, useful in explaining a conventional photomask produced using the shot pattern shown in FIG. 1B.
Figure 1D:
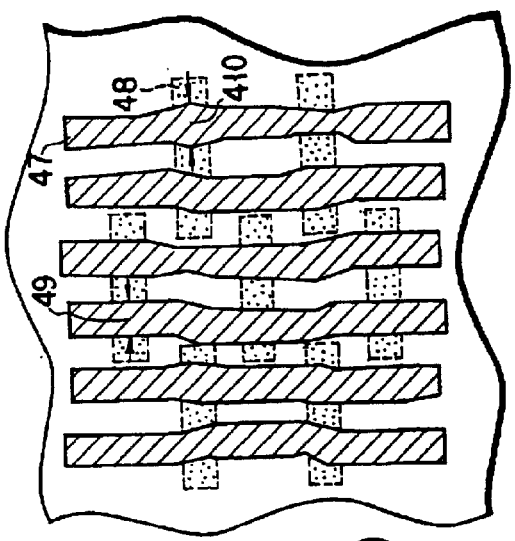
FIG. 1D is a schematic plan view, useful in explaining a conventional pattern on wafer worked using the photomask shown in FIG. 1C.
Figure 1A:
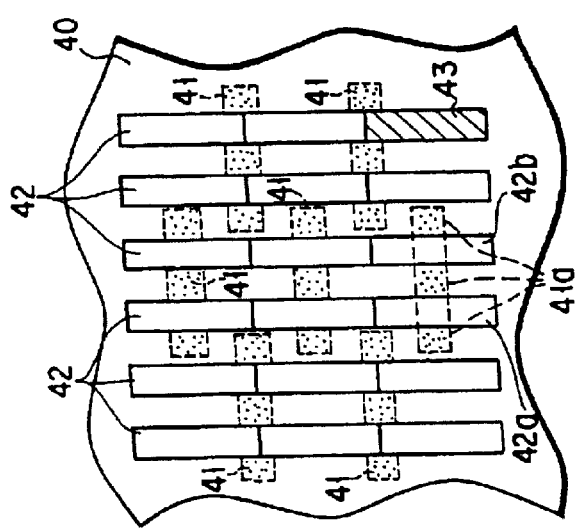
FIG. 1A is a schematic plan view, useful in explaining a conventional mask design, including drawing elements divided by a conventional drawing division method.

FIG. 1A is a plan design view, showing a memory cell array pattern employed in a VLSI. In FIG. 1A, reference numeral 41 denotes an active area pattern, and reference numeral 42 a gate pattern. The gate pattern 42 should be noted. Although the active area pattern 41 is formed, using a mask, in a layer different from a layer in which the gate pattern is formed using another mask, the active area pattern is indicated by the broken lines in order to clarify the positional relationship between the active area pattern 41 and the gate pattern 42. The active areas 41 are isolated by a peripheral isolation region 40. Two gate lines 42a and 42b intersect a single active area 41a, thereby forming two transistors connected in series.

To actually form a gate pattern on a wafer, a photomask is formed on the basis of a plan design drawing, thereby radiating the photomask with light to transfer an image of the mask on the wafer. The photomask is formed by depositing an opaque film on a major surface of a quartz substrate, then coating a resist thereon, writing a mask image in the aforementioned manner using a mask writing tool (i.e. with an electron beam or a laser beam), developing the resist and etching the opaque film.

Figure 1B:
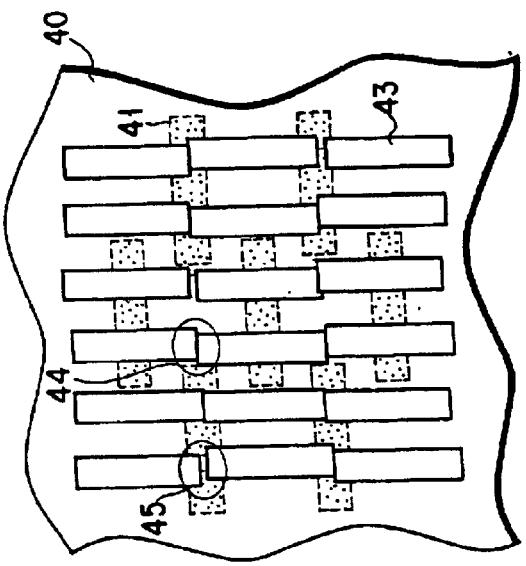
FIG. 1B is a schematic plan view, useful in explaining a conventional shot pattern produced on the basis of the design of FIG. 1A, wherein the divided elements are actually shot on the mask substrate.

The mask writing tool divides a to-be-drawn device pattern into portions of dimensions which it can draw, and exposes each portion. Accordingly, the gate pattern 42 shown in FIG. 1A is divided into elements 43 (a portion hatched for easy recognition) which each correspond to one shot exposure. At the time of exposing each element 43 by the mask writing tool, the actual point of exposure may well be displaced from a target point because of the abovementioned tool error. FIG. 1B shows an example of a state in which the elements of the gate pattern are actually exposed on the photomask substrate. To clarify the positional relationship between the active area pattern and the gate pattern, the active area pattern is indicated by the broken lines as in the case of FIG. 1A.

In the conventional case shown in FIG. 1B, there are gate pattern portions which are butt-joined to each other on the isolation region 40 as indicated by reference numeral 44, while there are gate pattern portions which are butt-joined to each other on the active area pattern as indicated by reference numeral 45. FIG. 1C is a plan view, showing a photomask drawn by the above method. In FIG. 1C, reference numeral 46 denotes the gate pattern. Since in this case, a negative-type resist has been used, the resist remains in exposed portions after development. Using the resist as a mask, the opaque film is etched thereby to form a pattern. Also in FIG. 1C, the active area pattern is indicated by the broken lines so as to clarify the positional relationship between the active area pattern and the gate pattern. As is evident from FIG. 1C, the butting portions of the gate pattern have different dimensions.

FIG. 1D is a plan view, showing a gate pattern on a wafer resulting from exposure using the photomask of FIG. 1C. Since in this case, a positive-type resist has been used, the resist remains in unexposed portions after development. Reference numeral 47 denotes portions on which the resist remains. Using the resist pattern as a mask, the wafer is etched. Also in FIG. 1D, an active area pattern 48 formed in a previous step is shown under the gate pattern.

Those portions of the gate pattern on the photomask which correspond to the butting portions of the photomask as shown in FIG. 1C have different dimensions. Therefore, at a portion as indicated by reference numeral 49 in FIG. 1D, at which writing is performed by a single shot on an active area, high dimension accuracy is obtained. On the other hand, at a portion as indicated by reference numeral 410, at which the dimension greatly varies on an active area, variations in dimension adversely affect the transistor characteristics, thereby increasing the range of variations in device characteristics in the chip.

As described above, in the conventional case, shot exposure is performed in voluntary positions at the time of write a gate pattern for transistors in mask writing. Accordingly, the gate pattern may have a butting portion located in a corresponding portion of an active area. The butting portion on the active area pattern will adversely affect the transistor characteristics and hence increase the range of variations in device characteristics. Thus, in the conventional case, there may be a butting portion even in a region in which high dimension accuracy must be required, with the result that stable device characteristics cannot be obtained.

The present invention has been developed in light of the above-described circumstances. The invention will be described in detail with reference to the drawings.

First Embodiment

Figure 2A:
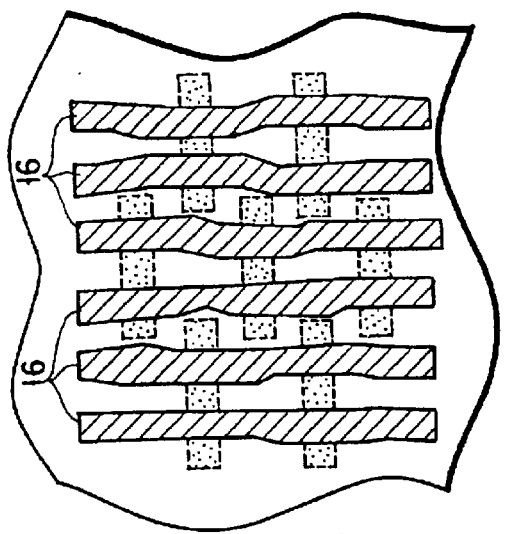
FIG. 2A is a schematic plan view, useful in explaining a mask design according to a first embodiment of the invention, including drawing elements divided by the division method of this invention.

Referring first to FIGS. 2A–2D, a first embodiment of the invention will be described. FIG. 2A is a plan design drawing, showing a memory cell array pattern employed in a VLSI. Reference numeral 11 denotes an active area pattern, and reference numeral 12 a gate pattern. The gate pattern 12 should be noted. Although the active area pattern 11 is formed, using a mask, in a layer different from a layer in which the gate pattern is formed using another mask, the active area pattern is indicated by the broken lines in order to clarify the positional relationship between the active area pattern 11 and the gate pattern 12. The active area pattern 11 is surrounded by a peripheral isolation region 10. In the actual semiconductor element, the gate pattern 12 is formed on both the active area pattern 11 and the isolation region 10. Two gate lines 12a and 12b intersect a single active area, for example, 11a, thereby forming two transistors connected in series (a memory cell of a so-called 2-cell 1-bit-line structure).

To actually form a gate pattern on a wafer, a photomask is formed on the basis of a plan design drawing, thereby radiating the photomask with light to transfer an image of the mask to the wafer. The photomask is formed by depositing an opaque film on a major surface of a quartz substrate, then coating a resist thereon, writing a mask image in the aforementioned manner using a mask writing tool (i.e. with an electron beam or a laser beam), developing the resist and etching the opaque film.

The mask writing tool divides a to-be-drawn device pattern into portions of dimensions which it can draw, and exposes each portion. Accordingly, the gate pattern 12 shown in FIG. 2A is divided into elements 13 which each correspond to one shot exposure (the element 13 is hatched for easy understanding). Suppose the case where the element 13 is formed by shot exposure in a position deviated from a predetermined position because of a tool error.

Figure 2B:
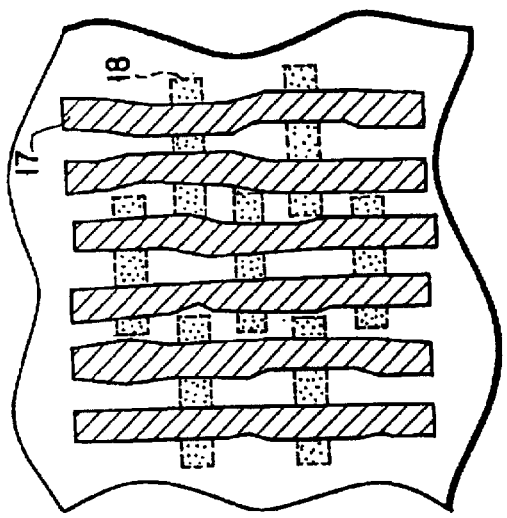
FIG. 2B is a schematic plan view, useful in explaining a shot pattern according to the first embodiment, produced on the basis of the design of FIG. 2A, wherein the divided elements are actually shot on the mask substrate.

FIG. 2B shows a state in which the elements of the gate pattern are actually exposed on the photomask. To clarify the positional relationship between the active area pattern and the gate pattern, the active area pattern is indicated by the broken lines as in the case of FIG. 2A. In this embodiment, all elements of the gate pattern are divided such that they are butt-joined on the isolation region 10.

Figure 2C:
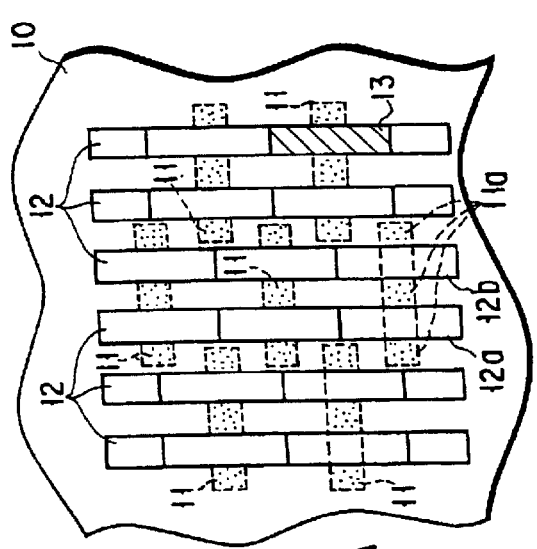
FIG. 2C is a schematic plan view, useful in explaining a photomask according to the first embodiment, produced using the shot pattern shown in FIG. 2B.

FIG. 2C is a plan view, showing a photomask drawn by the method of the invention. In FIG. 2C, reference numeral 16 denotes the gate pattern. Since in this case, a negative-type resist is used, the resist remains in exposed portions after development. Using the resist as a mask, the opaque film is etched thereby to form a pattern. Also in FIG. 2C, the active area pattern is indicated by the broken lines so as to clarify the positional relationship between the active area pattern and the gate pattern. As is evident from FIG. 2C, the butting portions of the gate pattern have different dimensions.

Figure 2D:
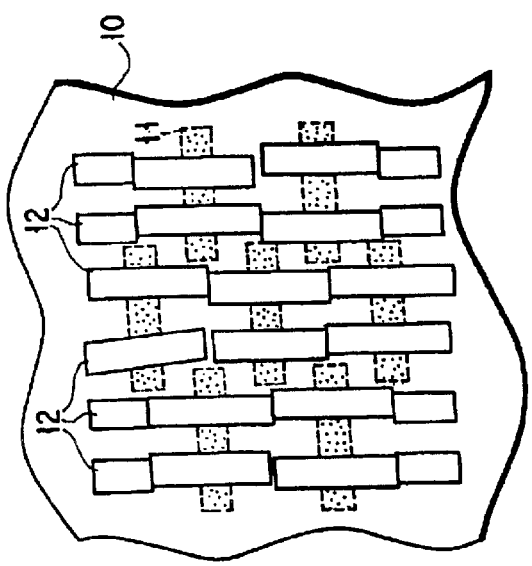
FIG. 2D is a schematic plan view, useful in explaining a pattern on wafer according to the first embodiment, worked using the photomask shown in FIG. 2C.

FIG. 2D is a plan view, showing a gate pattern on a wafer resulting from exposure using the photomask of FIG. 2C. Since in this case, a positive-type resist is used, the resist remains in unexposed portions after development. Reference numeral 17 denotes portions on which the resist remains. Using the resist pattern as a mask, the wafer is etched. Also in FIG. 2D, an active area pattern 18 formed in a previous step is shown under the gate pattern. The gate length is 0.15 μm.

Also in the first embodiment of the invention, those portions of the gate pattern on the photomask which correspond to displaced portions of the photomask due to shot exposure as shown in FIG. 2C have different dimensions. In this embodiment, however, all the butting portions with different dimensions are located in the isolation region. Accordingly, the range of variations in dimension is extremely small in the area corresponding to the active areas, with the result that a dimension accuracy of ±0.0105 μm or less according to the specifications relating to gate dimensions can be achieved over the entire surface of the chip. There may be a case where a butting portion in the isolation region has a wide width and extends even to an active area. In this case, however, only the area of a source/drain region varies, and influence upon the transistor characteristics can be ignored.

As described above, in the first embodiment, the butting portions of the gate pattern are located in the isolation region at the time of forming a gate pattern by mask writing, thereby minimizing variations in the dimensions of the gate pattern on the active area pattern and hence minimizing variations in device characteristics.

Second Embodiment

Referring then to FIGS. 3A–3D, a second embodiment of the invention will be described. FIG. 3A is a plan design view, showing an electrode pattern for a contact hole included in the gate pattern of transistors incorporated in a VLSI. Reference numeral 21 denotes an element included in the gate pattern, and reference numeral 22 an element indicative of an electrode pattern in a contact region of the gate pattern. A contact hole pattern 23 is formed in a layer different from a layer in which the gate pattern is formed. However, to clarify the positional relationship between the gate pattern and the contact hole pattern, the contact hole pattern is indicated by the broken lines.

A photomask is formed on the basis of the plan design view of FIG. 3A, thereby radiating the photomask with light to transfer an image thereof to the wafer. The photomask is formed in the same procedure as in the first embodiment. As aforementioned, the gate pattern is divided into elements 21 and 22, each of which is formed by a single shot of exposure.

At the time of forming the elements by shot exposure by means of a mask writing tool, their images may be formed in positions deviated from predetermined positions. FIG. 3B shows a case where the elements of the gate pattern are formed on those portions of the photomask which are deviated from predetermined portions. To clarify the positional relationship between the gate pattern and the contact hole pattern, the contact hole pattern is indicated by the broken lines as in the FIG. 3A case. At butting portion 27 between the elements 21 and 22, there occurs a disconnection due to shot displacement.

The second embodiment is characterized in that the element (electrode) 22 of the gate pattern to be butt-joined to the contact hole is formed by a single shot of exposure. FIG. 3C is a plan view, showing a photomask formed in the method employed in the second embodiment. In FIG. 3C, a hatched pattern 25 is the gate pattern. Since in this case, a negative-type resist is used, the resist remains in exposed portions after development. Using the resist as a mask, the opaque film is etched thereby to form a photomask pattern. Also in FIG. 3C, the contact hole pattern 23 is indicated by the broken lines so as to clarify the positional relationship between the gate pattern and the contact hole pattern. As is evident from FIG. 3C, the portion 28 corresponding to the butting portions of the elements have reduced dimensions.

FIG. 3D is a plan view, showing a gate pattern on a wafer resulting from exposure using the photomask of FIG. 3C. Since in this case, a positive-type resist is used, the resist remains in unexposed portions after development. In FIG. 3D, reference numeral 26 denotes a portion on which the resist remains. Using the resist pattern as a mask, a conductive layer formed on a wafer is etched. Also in FIG. 3D, a contact hole pattern 23 formed in a later step is indicated by the broken lines. The gate length is 0.15 $\mu$m.

In FIG. 3D, those portions 29 of the gate pattern which correspond to the butting portions of the photomask of FIG. 3C with reduced dimensions have reduced dimensions. In this embodiment, however, all the butting portions with reduced dimensions are located in the region other than the contact hole. Accordingly, the range of reductions in dimension is extremely small where the contact hole is connected, with the result that no contact failure and good device characteristics can be achieved.

Figure 7:
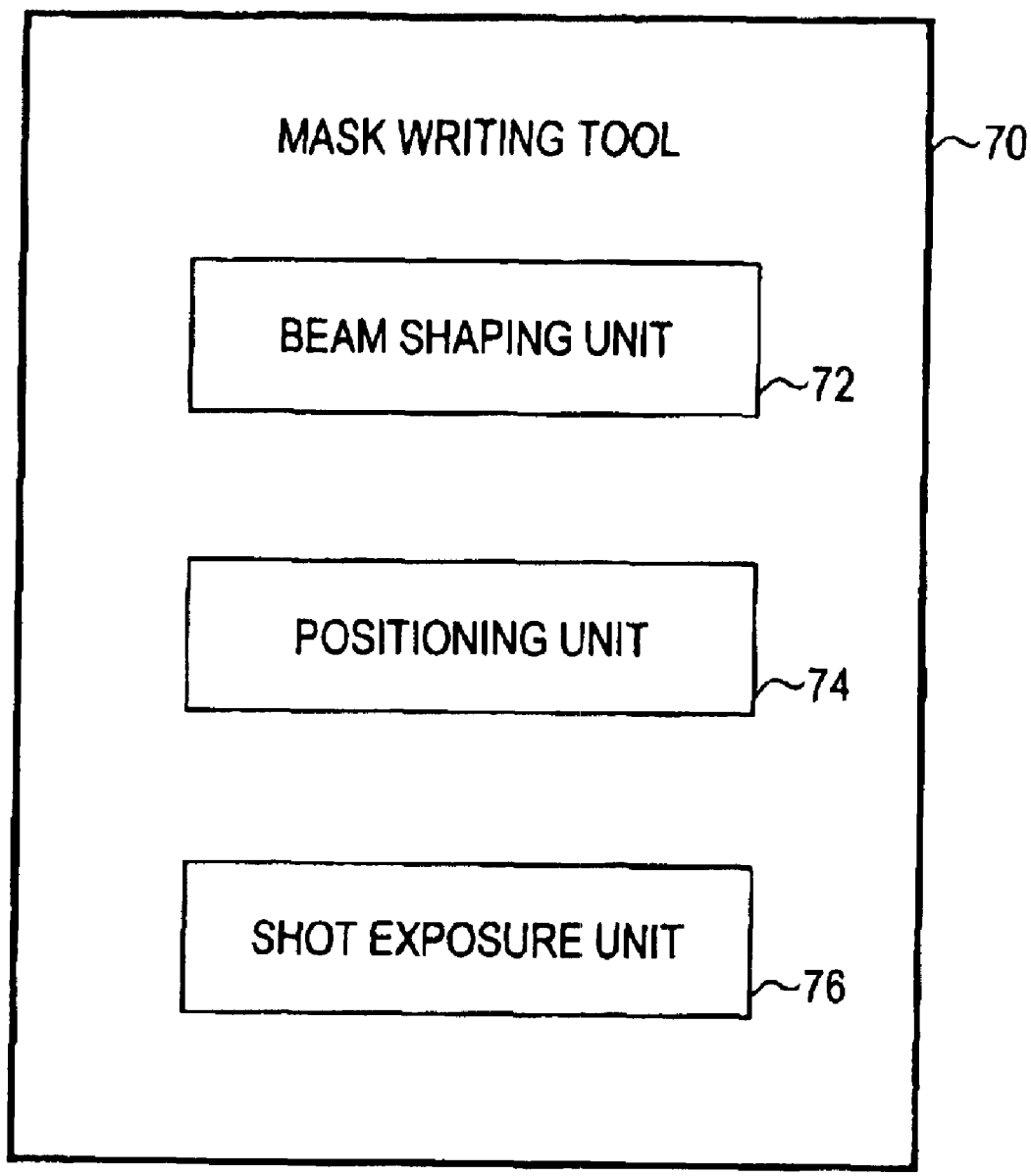
FIG. 7 is a block diagram of a mask writing tool used in this invention.

In the first and second embodiments, there is provided a mask writing tool 70 (an apparatus for forming a pattern for a semiconductor device), as shown in FIG. 7, which comprises a beam shaping unit 72 for shaping, to a predetermined shape, one of a charged particle beam and an electromagnetic beam, a positioning unit 74 for positioning the position of the beam of the predetermined shape in a single unit region of a substrate with a photosensitive film formed thereon, and a shot exposure unit 76 for radiating the single unit region with the beam for a predetermined period of time. The shot exposure unit 76 repeats shot exposure in units of a single unit region to thereby form a desired exposed region, and the positioning unit 74 sequentially forwards the position in which the beam is to be radiated, butt-joins the single unit region to another single unit region to form a plurality of butt-unit regions, and situates butting portions of the butt-jointed unit regions constituting the desired exposed portion, in a first area of a layer to be formed other than a second area of the first layer in which predetermined characteristics of a function of the semiconductor device are determined by a pattern width of the exposed region in association with another pattern formed in another layer.

Although in the first and second embodiments, the pattern forming method, the pattern forming apparatus, the mask itself, and the semiconductor devices produced using them have been described with reference to a photomask for producing a semiconductor device, in particular, to exposure of a gate layer for transistors, the invention is not limited to the above. The subject matter of the invention lies in that any portion which requires high accuracy of dimension is subjected to single shot exposure, and in portions which do not require high accuracy of dimension shots are butt-joined to each other. This technique is also applicable to a mask for exposure using X-rays, a mask for image transfer using an electron beam, or to a direct writing technique for directly writing a pattern on a wafer without any masks.

Third Embodiment

A third embodiment suitable to production of a reticle using a variable shaped electron beam will now be described.

First, a 6-inch square blank with a thickness of 0.25 inch, which includes a quartz substrate and an opaque film consisting of a chrome thin film and a chrome oxide film laminated thereon, is coated with a film of negative-type electron beam resist SAL605 (produced by Shipley Corporation) with a thickness of 0.5 $\mu$m, and then subjected to a predetermined baking treatment. Subsequently, the resultant structure is subjected to an exposure treatment using a variable shaped electron beam (VSB) aligner which is operable with an acceleration voltage of 15 KeV.

The exposure treatment is performed by a variable shaped beam method. In this method, two apertures provided in the aligner are combined. A beam having passed a first aperture is further passed a second aperture, to thereby create a beam with a square cross section having each side of 2.55 $\mu$m at maximum or with a right-angled triangular cross section having a shorter side of 2.55 $\mu$m at maximum. Further, the amount of exposure is varied for each pattern. Those portions of a pattern which are to be exposed by a single shot are exposed with a beam of 8 $\mu$C/cm$^2$, while the other portions are exposed with a beam of 2 $\mu$C/cm$^2$. Thereafter, those portions having been exposed with the beam of 2 $\mu$C/cm$^2$ are further exposed three times with the beam of 2 $\mu$C/cm$^2$. Accordingly, the amount of exposure of the overall pattern is 8 $\mu$C/cm$^2$. At the time of subjecting patterns of the same shape to single-shot exposure, it is desirable to use the same combination of optically overlapping manners of the first and second apertures. This is because even if the patterns have the same shape, a difference may occur in dimension accuracy when the apertures are made to optically overlap each other in different manners.

Subsequently, the resultant substrate is taken out of the aligner, and subjected to a predetermined baking treatment. Then, the resultant substrate is subjected, for 80 seconds, to a puddle development treatment using a dedicated developer, then to a rinse treatment using deionized water, and to a drying treatment to thereby form a resist pattern. Thereafter, the resultant structure is baked at 115° C. for 15 minutes. Then, the resultant structure is subjected to descum etching performed by a diode parallel plate RF plasma etching system using a gas mixture of oxygen and nitrogen (oxygen:nitrogen=15:85). The descum etching is performed for 45 seconds with a power of 50 W under a negative pressure of 100 mTorr.

The resultant structure is then etched at 70° C. by means of a parallel plate magnetron RF plasma etching system, using a gas mixture of chloride, oxygen and argon (chloride:oxygen:argon=95:5:100). The etching is performed with a power of 150 W for 15 minutes. Thereafter, the resist on the resultant structure is removed by etching using ozone as a main reactive gas.

Figure 4A:
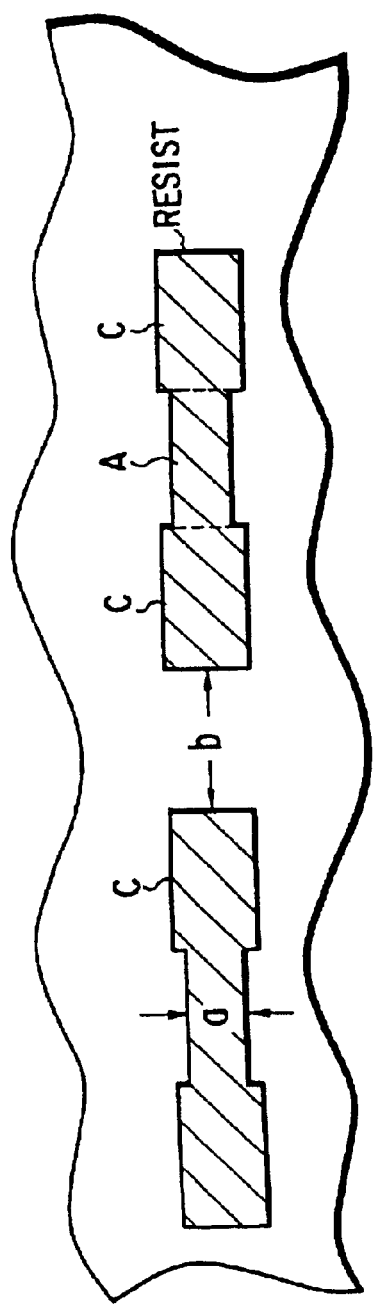
FIG. 4A is a view, useful in explaining a mask size employed in a third embodiment of the invention.
Figure 4B:
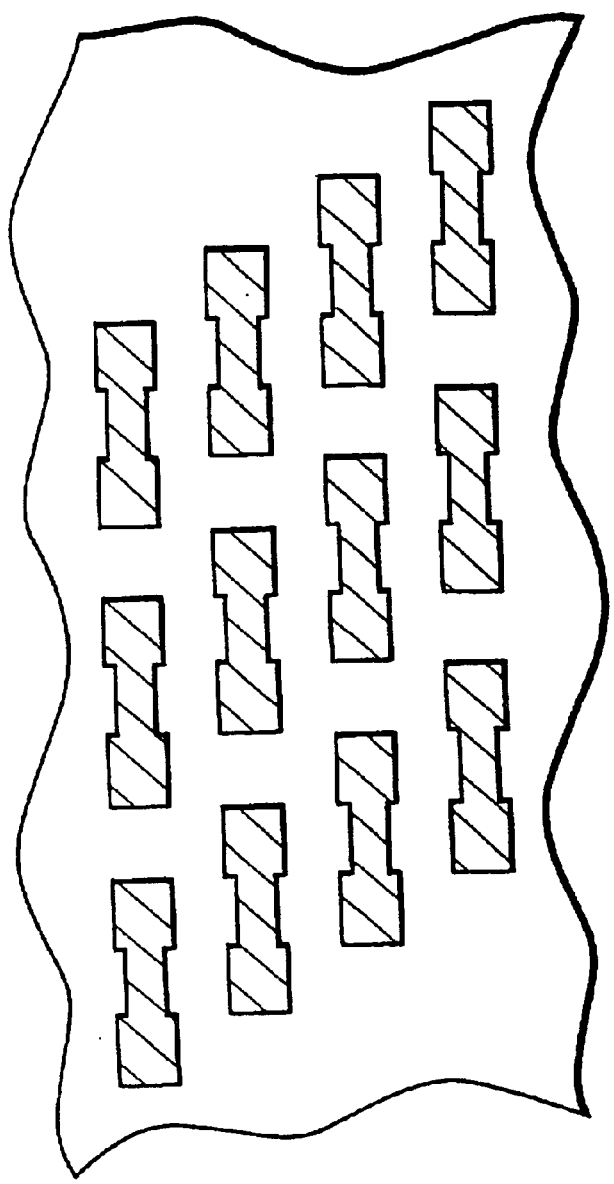
FIG. 4B is a view, showing a pattern layout according to the third embodiment.

The mask thus produced is shown in FIGS. 4A and 4B. For facilitating the explanation of a pattern, FIG. 4A shows only a pair of pattern portions. A width a of each pattern portion (its designed value is 0.64 μm) and an interval b between each pair of adjacent pattern portions (its designed value is 0.72 μm) were measured with respect to those 100 portions of a mask which were taken from an edge of the mask. The measured mask has a pattern portion repeated as shown in FIG. 4B. The measurements provides variations in which 12.8 nm and 32 nm are obtained at 3σ (σ:standard variation) concerning the width a and the interval b, respectively. In FIGS. 4A and 4B, the hatched portions are opaque film portions remaining after exposure, development and etching. This mask is an enlarged one which has an area four times the area of the actual LSI pattern. The pattern includes portions A which each have a length of 0.64 μm and a breadth of 1.2 μm, and portions C which each have a length of 0.72 μm and a breadth of 1.2 μm.

The width a indicates the length of the portion A formed by single shot exposure (writing), while the interval b indicates the interval between the portions C formed by four-time shot exposure (writing). The portions A of the pattern were preferentially located at center portions of the mask so that no butting portions would be formed therein.

As described above, in the third embodiment, the portions A which require high accuracy of dimensions are formed by single shot writing, and the portions C which require high accuracy of position are formed by four-time shot writing, with the result that the pattern intervals are set very precisely, with particular portions of the pattern formed with high accuracy of dimensions.

In the conventional method, the butting portions of the elements of a pattern are situated in any voluntary positions, and also there is no principle as to whether single shot exposure or multiple shot exposure should be used. Accordingly, variations in dimensions a and b in FIG. 4A reach as high as 25 nm and 60 nm, respectively. It is evident from these results that the present invention provides a significant advantage.

Figure 5A:
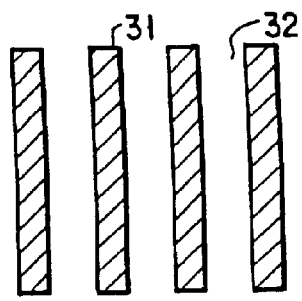
FIG. 5A is a view, showing another pattern according to the third embodiment.
Figure 5B:
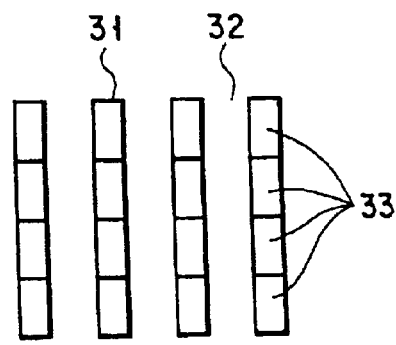
FIGS. 5B–5E show forming of the pattern of FIG. 5A in a stepwise manner.
Figure 5C:
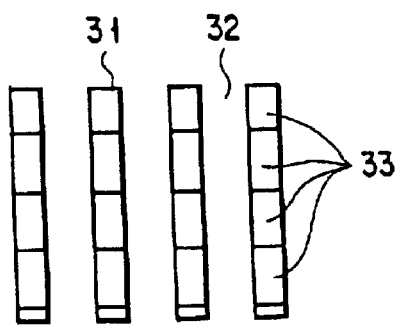
Figure 5D:
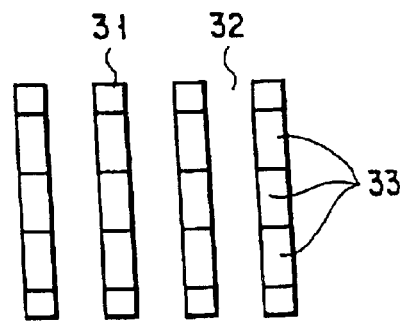
Figure 5E:
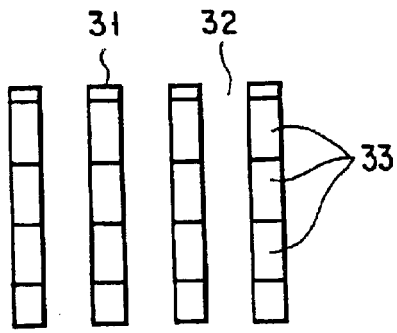

To make butting portions inconspicuous in a pattern with lines 31 and spaces 32 (i.e. an L/S pattern) as shown in FIG. 5A, exposure should be performed as follows:

As is shown in FIGS. 5B–5E, the L/S pattern is formed by displacing the shot exposure positions of elements 33 from each other in units of a single exposure treatment. More specifically, in a first exposure treatment, the elements 33 are butt-joined in positions shown in FIG. 5B. Similarly, in a second exposure treatment, the elements 33 are butt-joined in positions shown in FIG. 5C, and in a third exposure treatment, they are butt-joined in positions shown in FIG. 5D. In a fourth or the last exposure treatment, the elements 33 are butt-joined in positions shown in FIG. 5E. Thus, shot exposure is performed four times in total. These exposure treatments make the butting portions of the L/S pattern inconspicuous.

As described above, depending upon the purpose, the invention can switch the exposure method, on a single layer, between the multiple shot exposure shown in FIG. 4A (in which the same shot exposure is repeated in the same position), and the multiple shot exposure shown in FIGS. 5B–5E (in which the butting positions are changed).

Fourth Embodiment

A fourth embodiment suitable to production of a reticle using a variable shaped electron beam will be described.

First, a substrate to be exposed, which is coated with positive-type beam resist ZEP-7000B (produced by Nippon Zeon Corporation), is prepared in the same process employed in the third embodiment. In the fourth embodiment, only an exposure portion in which a particular unexposed portion is to be formed is subjected to eight-time shot exposure, and other portions are subjected to single shot exposure. The required treatment time was about 37 minutes in the case of subjecting the overall substrate to single shot exposure, and about 41 minutes 30 seconds in the case of subjecting part of the substrate to aforementioned eight-time shot exposure. The amount of exposure is 10 μC/cm². The substrate taken from the exposure unit is subjected to a spray developing treatment for 360 seconds using a dedicated developer, then to a rinse treatment and to a dry treatment, thereby forming a resist pattern.

Thereafter, an etching treatment is performed after the same treatments as in the third embodiment are performed, thereby producing a mask as shown in FIGS. 6A and 6B. For facilitating the explanation of the dimensions, only a pair of pattern portions are shown in FIG. 6A. A width a of each pattern portion (its designed value is 0.64 μm) and an interval b between each pair of adjacent pattern portions (its designed value is 0.72 μm) were measured with respect to those 100 portions of a mask which were taken from an edge of the mask. The measured mask has a pattern portion repeated as shown in FIG. 6B. The measurements provides variations in which satisfactory values of 18.0 nm and 21.3 nm are obtained at 3σ(σ:standard variation) concerning the width a and the interval b, respectively. In FIG. 6B, the hatched portion is an opaque film with openings formed after exposure, development and etching. This mask is an enlarged one having an area four times the area of the actual LSI pattern. The pattern includes openings A which each have a length of 0.64 μm and a breadth of 1.2 μm, and openings C which each have a length of 0.72 μm and a breadth of 1.2 μm.

The width a indicates the length of the opening A formed by single shot exposure (writing), while the interval b indicates the interval between the openings C formed by four-time shot exposure (writing). The openings A of the pattern were preferentially located at center portions of the mask so that no butting portions would be formed therein.

In the third and fourth embodiments, there is provided a mask writing tool 70 (an apparatus for forming a pattern for a semiconductor device), as shown in FIG. 7, which comprises a beam shaping unit 72 for shaping, to a predetermined shape, one of a charged particle beam and an electromagnetic beam, a positioning unit 74 for positioning the position of the beam of the predetermined shape in a single unit region of a substrate with a photosensitive film formed thereon, and a shot exposure unit 76 for radiating the single unit region with the beam for a predetermined period of time. The shot exposure unit 76 subjects predetermined ones of the unit regions to single shot exposure, and the other ones of the unit regions to multiple shot exposure, and the positioning unit 74 sequentially forwards the position in which the beam is to be radiated, and butt-joins the single region to another single unit region to form a plurality of butt-joined unit regions.

Although in the third and fourth embodiments, the pattern forming method, the pattern forming apparatus, the mask itself, and the semiconductor devices produced using them have been described with reference to a photomask for producing a semiconductor device, the invention is not limited to the above. The subject matter of the invention lies in that any portion which requires high accuracy of dimension is subjected to single shot exposure, whereas portions which do not require high accuracy of dimension are subjected to multiple shot exposure. This technique is also applicable to a mask for exposure using X-rays, a mask for image transfer using an electron beam, or to a direct writing technique for directly writing a pattern on a wafer without any masks.

Moreover, as is evident from the descriptions recited in the third and fourth embodiments, the invention aims to provide a method for achieving required accuracy of dimension by the combination of multiple writing and single writing, or the combination of a portion formed by single shot exposure and a portion formed by multiple shot exposure. The invention can provide a technique for enhancing the accuracy of the dimensions of a particular portion by more free combination of exposure methods as a result of properly using a positive-type resist and a negative-type resist at the time of exposure. Further, at the time of performing multiple shot exposure, the invention can provide a more significant advantage by displacing regions (sub-fields), which are to be covered by a beam deflection maximum value, in units of a single shot exposure treatment, using a sub-deflector incorporated in the electron beam exposure apparatus.

In addition, the apparatus for writing a pattern is not limited to the electron beam writing apparatus, but may be an ion beam writing apparatus, or a laser writing apparatus using a light beam other than the charged particle beams. Also, the invention may be modified in various manners without departing from the scope thereof.

Since as described above, pattern portions formed by shots are butt-joined in particular regions determined on the basis of a pattern formed of another layer, variations in dimension of the butt-joined pattern portions are prevented from adversely affecting the device characteristics. As a result, variations in device characteristics can be minimized.

Furthermore, a pattern can be formed with substantially high accuracy by performing single shot exposure in a region in which high accuracy of dimension is required, and performing multiple shot exposure in a region in which high accuracy of position is required.

Additional advantages and modifications will readily occur to those skilled in the art. Therefore, the invention in its broader aspects is not limited to the specific details, and representative embodiments shown and described herein. Accordingly, various modifications may be made without departing from the spirit or scope of the general inventive concept as defined by the appended claims and their equivalents.

What is claimed is:

1. An apparatus for forming a pattern for a semiconductor device, comprising:
    beam shaping means for shaping, to a predetermined shape, one of a charged particle beam and an electromagnetic beam;
    positioning means for positioning the position of the beam of the predetermined shape in a single unit region of a substrate with a photosensitive film formed thereon, sequentially forwarding the position in which the beam is to be radiated, butt-joining the single unit region to another single unit region to form a plurality of butt-joined unit regions, and situating butting portions of the butt-joined unit regions constituting the desired exposed region, in a first area of a layer to be formed other than a second area of the layer in which predetermined characteristics of a function of the semiconductor device are determined by a pattern width of the exposed region in association with another pattern formed in another layer; and
    shot exposure means for radiating the single unit region with the beam for a predetermined period of time and for repeating shot exposure in units of a single unit region to thereby form a desired exposed region.

2. The apparatus according to claim 1, wherein the positioning means causes the second area in which the butting portions of the unit regions are formed, to correspond to an isolation region employed in the semiconductor device.

3. The apparatus according to claim 1, wherein the positioning means determines the position of the beam such that the second area in which the predetermined characteristics of the predetermined function are determined by the pattern width of the exposed region corresponds to an active region incorporated in a transistor in the semiconductor device.

4. The apparatus according to claim 1, wherein the positioning means determines the position of the beam such that the region in which the predetermined characteristics of the predetermined function are determined by the pattern width of the exposed region corresponds to an electrode region to which an interlayer contact in the semiconductor device is connected.

5. An apparatus for forming a pattern comprising:
    beam shaping means for shaping, to a predetermined shape, one of a charged particle beam and an electromagnetic beam;
    positioning means for positioning the position of the beam of the predetermined shape in a single unit region of a substrate with a photosensitive film formed thereon, sequentially forwarding the position in which the beam is to be radiated, and butt-joining the single unit region to another single unit region to form a plurality of butt-joined unit regions; and
    shot exposure means for radiating the single unit region with the beam for a predetermined period of time and for subjecting predetermined ones of the unit regions to single shot exposure, and the other ones of the unit regions to multiple shot exposure.

6. The apparatus according to claim 5, wherein the shot exposure means performs the multiple shot exposure by repeating the same shot exposure in the same position.

7. The apparatus according to claim 5, wherein the shot exposure means performs the multiple shot exposure by changing the butting position of the unit regions in units of a single shot exposure treatment.

8. The apparatus according to claim 5, wherein the shot exposure means performs the multiple shot exposure by selectively using multiple shot exposure in which the same shot exposure is repeated in the same position, and multiple shot exposure in which the butting position of the unit regions is changed in units of a single shot exposure treatment.

* * * * *